US006988164B1

(12) United States Patent
Wanzakhade et al.

(10) Patent No.: US 6,988,164 B1
(45) Date of Patent: Jan. 17, 2006

(54) COMPARE CIRCUIT AND METHOD FOR CONTENT ADDRESSABLE MEMORY (CAM) DEVICE

(75) Inventors: Sanlay M. Wanzakhade, San Jose, CA (US); Michael C. Stephens, Jr., San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 268 days.

(21) Appl. No.: 10/320,588

(22) Filed: Dec. 16, 2002

Related U.S. Application Data

(60) Provisional application No. 60/343,973, filed on Dec. 27, 2001.

(51) Int. Cl.
*G06F 12/00* (2006.01)

(52) U.S. Cl. ......................... 711/108; 711/128; 365/49; 365/50

(58) Field of Classification Search ................ 711/108; 365/49; 709/238
See application file for complete search history.

(56) References Cited

U.S. PATENT DOCUMENTS

| | | | | |
|---|---|---|---|---|
| 5,534,844 | A | 7/1996 | Norris | |
| 6,081,440 | A | 6/2000 | Washburn et al. | |
| 6,108,227 | A | 8/2000 | Voelkel | |
| 6,161,144 | A * | 12/2000 | Michels et al. | 709/238 |
| 6,240,000 | B1 | 5/2001 | Sywyk et al. | |
| 6,253,280 | B1 | 6/2001 | Voelkel | |
| 6,266,262 | B1 | 7/2001 | Washburn et al. | |
| 6,480,406 | B1 | 11/2002 | Bo et al. | |
| 6,502,163 | B1 | 12/2002 | Ramankutty | |
| 6,504,740 | B1 | 1/2003 | Voelkel | |
| 6,505,270 | B1 | 1/2003 | Voelkel et al. | |
| 6,515,884 | B1 | 2/2003 | Sywyk et al. | |
| 6,647,457 | B1 | 11/2003 | Sywyk et al. | |
| 6,661,716 | B1 | 12/2003 | Sywyk et al. | |
| 6,697,275 | B1 | 2/2004 | Sywyk et al. | |
| 6,721,202 | B1 | 4/2004 | Roge et al. | |
| 6,748,484 | B1 * | 6/2004 | Henderson et al. | 711/108 |
| 6,751,755 | B1 | 6/2004 | Sywyk et al. | |
| 6,763,426 | B1 | 7/2004 | James et al. | |
| 6,772,279 | B1 | 8/2004 | Sun et al. | |
| 6,804,744 | B1 | 10/2004 | Abbas | |
| 6,845,024 | B1 * | 1/2005 | Wanzakhade et al. | 365/49 |
| 6,876,558 | B1 | 4/2005 | James et al. | |
| 6,892,273 | B1 | 5/2005 | James et al. | |
| 2002/0129198 | A1 * | 9/2002 | Nataraji et al. | 711/108 |
| 2004/0012989 | A1 * | 1/2004 | Park et al. | 365/49 |

OTHER PUBLICATIONS

U.S. Appl. No. 10/317,918, filed Feb. 2002, Wanzakhade et al.*
U.S. Appl. No. 10/281,814, James et al., date not published.

* cited by examiner

*Primary Examiner*—Donald Sparks
*Assistant Examiner*—Jesse Diller
(74) *Attorney, Agent, or Firm*—Bradley T. Sako

(57) ABSTRACT

A content addressable memory (CAM) device (100) may include a number of sub-blocks (102-8 to 102-15) that can generate CAM search results. In a "search beyond" operation, sub-blocks (102-8 to 102-15) may be excluded from a search operation according to criteria, including a sub-block address and a soft-priority value. A CAM device may include a compare circuit (400) that may compare sub-block address values in a time division multiplexed fashion to establish priority from among multiple CAM sub-blocks.

19 Claims, 4 Drawing Sheets

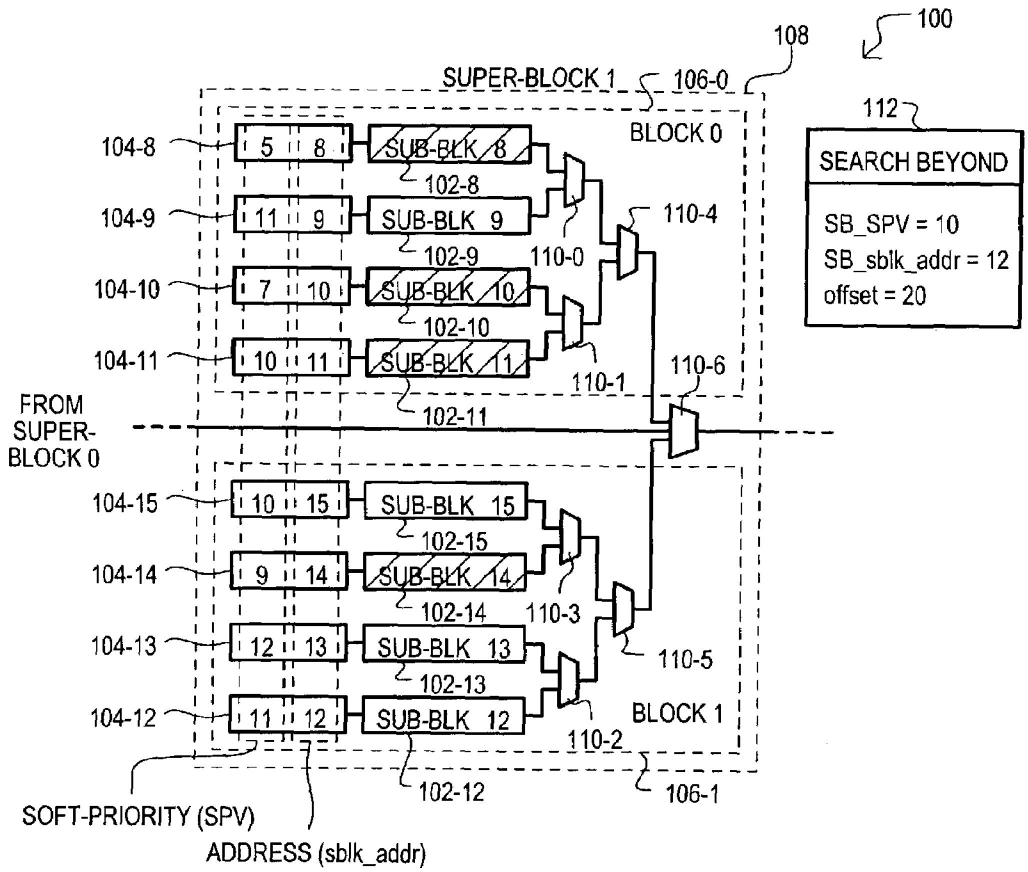

FIG. 1

```
If ({(SB_sblk_addr > sblk_addri) && (SB_SPV = SPVi)}
        || (SB_SPV > SPVi))
                Ii = 1 (ignore sub-block i)
If ({(SB_sblk_addr > sblk_addrj) && (SB_SPV = SPVj}
        || (SB_SPV > SPVj))
                Ij = 1 (ignore sub-block j)
If ((SPVi <= SPVj) && Ii=0 && Ij=0)
        ACTi = 0 (make active as primary sub-block)
        ACTj = 0' (make active as secondary sub-block)
else if ((SPVi > SPVj) && Ii=0 && Ij=0)
        ACTi = 0' (make active as secondary sub-block)
        ACTj = 0 (make active as primary sub-block)
```

FIG. 2

COMPARE CIRCUIT AND METHOD FOR CONTENT ADDRESSABLE MEMORY (CAM) DEVICE

This application claims the benefit of provisional application Ser. No. 60/343,973 filed Dec. 27, 2001.

TECHNICAL FIELD

The present invention relates generally to content addressable memory (CAM) devices and particularly to search operation circuits for CAM devices.

BACKGROUND OF THE INVENTION

Due to the increasing need for rapid matching capabilities, in networking hardware equipment for example, content addressable memories (CAMs) continue to proliferate. A CAM may perform matching functions by applying a search key or "comparand" to a table of stored data values. A CAM may then determine if any of the data values match a given search key.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic RAM (DRAM) type cells. Alternate approaches may include RAM arrays, or the like, with separate matching circuits and/or matching processes executed by a processor, or the like.

Conventional CAM devices may include both binary and ternary CAM devices. Binary CAM devices can provide a bit-by-bit comparison between a stored data value and a search key. Ternary CAM devices can provide maskable compare operations that can selectively exclude predetermined bits of a data value from a compare operation.

Typically, a conventional CAM device can generate match indications for each valid entry. That is, each entry can be compared with an applied search key value. If a search key value matches a stored data value, a match (or "hit") indication may be generated for the entry. Conversely, if a key value does not match a stored data value, a mismatch (or "miss") indication may be generated for the entry.

Match results in a CAM device may include single match results that can be generated when a single entry matches an applied key value, as well as multiple match results, that may be generated when more than one entry matches an applied key value.

Conventionally, when a CAM device generates multiple match results, a priority encoder, or the like, can prioritize from among such multiple matches and output an indication corresponding to a single match entry. Typically, priority from among multiple matching entries can be established according to entry address (e.g., lowest address corresponds to highest priority).

While a priority encoder, or the like, can select from among multiple matching entries, it can be desirable to identify other lower priority matching entries. A conventional approach to identifying lower priority addresses in a multiple match case will now be described.

Referring now to FIGS. 9A–9C, a conventional content addressable memory (CAM) device is set forth and designated by the general reference character 900. A conventional CAM device 900 may include a number of entries 902-0 to 902-n, each for storing data values for comparison with a search key value. A CAM device 900 may also include a match indicator bit 904-0 to 904-n corresponding to each entry (902-0 to 902-n). The function of match bits (904-0 to 904-n) will be described in more detail below.

Entries (902-0 to 902-n) may each generate a match indication M0 to Mn. Match indications (M0 to Mn) can indicate when data values in a corresponding entry (902-0 to 902-n) match an applied search key value. Match indications may be prioritized and encoded into an index value by a priority encoder 910.

A search key value KEY may be applied to entries (902-0 to 902-n) from a search key input 906. Along with a search key, a key match bit 908 may be applied to match bits (904-0 to 904-n) of entries (902-0 to 902-n). Conventionally, match bits (904-0 to 904-n) can function in the same way as a data value bit within an entry. If a key match bit 908 does not match a match bit (904-0 to 904-n) a match indication can be forced to a "miss" state. Thus, in the conventional arrangement of FIGS. 9A to 9C, a match indication can be in a "hit" state when both a data value and a corresponding match bit for the entry matches a search key value and key match bit, respectively.

In FIG. 9A it is assumed that an applied search key value KEY matches data values stored in entries 902-1, 902-3 and 902-4. In addition, prior to the application of a search key value KEY, match bits (904-0 to 904-n) can all be set to a same value as key match bit 908. Thus, such match bits (904-0 to 904-n) may not generate a mismatch indication. Consequently, a CAM device 900 may have a multiple match state, shown by match indications M1, M3 and M4 having a "HIT" status.

A priority encoder 910 may prioritize resulting multiple match indications. In FIGS. 9A to 9C it will be assumed that physical priority is established with entry 902-0 having a highest priority and entry 902-n having a lowest priority. Accordingly, active match indication M1 can be encoded into an index value INDEX1.

In the conventional approach shown in FIGS. 9A to 9C, following the generation of multiple "HIT" match indications, match bits for all but the highest priority matching entry and a key match bit 908 can be changed to differ from match bits of non-matching entries. This is illustrated in FIG. 9B by match bits for lower priority matching entries 904-3 and 904-4, and key match bit 908 being changed from a "1" to a "0".

A subsequent search may then be performed with new match bit and key match bit values. This is shown in FIG. 9C.

In FIG. 9C, a same key value KEY as shown in FIG. 9A may be applied from a key input 906 to entries (902-0 to 902-n). In addition, a key match bit 908 may be applied to match bits (904-0 to 904-n). Due to a change in match bit values and a key match bit value as noted above, non-matching entries and a highest priority entry from the previous search as described are prevented from generating "HIT" match indications. Consequently, a second highest priority active match indication M3 may be prioritized and encoded by priority encoder 910 to generate an index value INDEX3. In this way, a next higher priority match result for a multiple match case may be extracted.

A conventional search operation may continue by changing match bit 904-3 from a "0" to a "1" and then searching once again with a same search key and key match bit value. Such a search may result in third highest priority match indication M4 being encoded into an in index value INDEX4 (not shown). Such an operation may continue in this fashion until all match results are extracted.

A drawback to the conventional approach noted above can be added time in executing the function and/or added complexity in circuits. In particular, multiple additional write operations may be necessary to set match bits in matching entries and to set a key match bit. In addition, a write operation may be necessary to set the match bit of each matching entry as lower priority matches are extracted.

Yet another drawback to such a conventional approach can be lack of flexibility in operation. In order to extract multiple match results, the state of the conventional CAM is essentially monopolized by the process. That is, while multiple match values are extracted, other search operations may not be performed as the setting of a key match bit can prevent a search of non-matching entries and/or higher priority entries that have been previously extracted.

In light of the above, it would be desirable to arrive at some way of extracting multiple match results that may be more flexible and/or faster than conventional approaches.

Additionally, it is always desirable to provide new search features in a CAM device for targeting searches to smaller search spaces (e.g., fewer numbers of entries). Such restricted search approaches may yield results faster than conventional approaches that do not restrict a search space. In addition or alternatively, restricting a search space may reduce power consumption by excluding some entries from search operations.

It is also desirable to arrive at ways of reducing overall device size, as such size reductions can translate to cost savings in an integrated circuit device.

SUMMARY OF INVENTION

According to the present invention, a content addressable memory (CAM) device can include an input select circuit that provides a first value associated with a first CAM portion during a first time period, and provides a second value associated with a second CAM portion during a second time period. A CAM device can also include at least one comparator circuit having at least two inputs. At least a first input of a comparator circuit can be connected to the input select circuit.

According to one aspect of the embodiments, an input select circuit can include a multiplexer having a first input that receives the first value and a second input that receives the second value, and a control input coupled to a clock signal.

According to another aspect of the embodiments, a CAM device may include a first CAM portion that can be a sub-block. A first value received by an input select circuit can be a first sub-block address that is common to CAM entries of the first CAM portion. In addition, a second CAM portion can be a sub-block, and a second value received by an input selector can be a second sub-block address common to the CAM entries of the second portion. In one arrangement, first and second sub-block addresses can be multi-bit values that differ from one another by one bit.

According to another aspect of the embodiments, a CAM device may further include an output select circuit that provides a first compare result from a comparator circuit during a first time period, and provides a second compare result from a comparator circuit during a second time period. In one arrangement, an output circuit can include a demultiplexer having an input connected to the compare circuit and a control input connected to a clock signal.

According to another aspect of the embodiments, a CAM device may include a comparator with an input connected to receive a third value associated with a search command.

According to another aspect of the embodiments, a CAM device may further include a first output store connected to a comparator circuit for storing a first compare result and a second output store connected to a comparator circuit for storing a second compare result.

The present invention may also include a method of establishing priority from among portions of a content addressable memory (CAM) device. The method can include comparing priority values associated with different portions of a CAM device at different time periods, where the portions of the CAM device each include multiple CAM entries.

According to one aspect of the embodiments, priority values for different portions of a CAM device can include sub-block address values for a CAM device having entries divided into multiple sub-blocks.

According to another aspect of the embodiments, comparing priority values associated with different CAM portions can include comparing a first sub-block address to a search sub-block address when a clock signal has a first value, and comparing a second sub-block address to a search sub-block address when the clock signal has a second value.

According to another aspect of the embodiments, priority values associated with different CAM portions can include soft-priority values, where such sub-block soft-priority values are programmable.

According to another aspect of the embodiments, a method may also include outputting compare results generated by comparing the priority values at different time periods.

According to another aspect of the embodiments, priority values associated with different CAM portions can include sub-block address values for a CAM device having entries divided into multiple sub-blocks. Further, outputting compare results can include outputting a compare result between a first sub-block address and a search sub-block address when a clock signal has a first value, and outputting a compare result between a second sub-block address and a search third sub-block address when a clock signal has the second value.

According to another aspect of the embodiments, priority values associated with different CAM portions can include sub-block address values and sub-block soft-priority values for a CAM device having entries divided into multiple sub-blocks. Soft-priority values can be programmable. Further, comparing priority values can include generating an ignore indication for a first sub-block if a search soft-priority value is greater than a first sub-block soft-priority value, or if a search soft-priority value is equal to a first sub-block soft-priority value and a search sub-block address value is greater than a first sub-block address. In addition, comparing priority values may also include generating an ignore indication for a second sub-block if a search soft-priority value is greater than a second sub-block soft-priority value, or if a search soft-priority value is equal to a second sub-block soft-priority value and a search sub-block address value is greater than a second sub-block address value.

The present invention may also include a magnitude comparator that includes a circuit that compares a magnitude of a first search address element to a magnitude of a second search address element during a first predetermined time interval and compares a magnitude of a first search priority element to a magnitude of a second search priority element during a second predetermined time interval.

According to one aspect of the embodiments, a first search address element can include an address commonly associated with a plurality of first CAM entries. Further, a search address element can include an address commonly associated with a plurality of second CAM entries.

According to another aspect of the embodiments, a first search priority element can include a programmable value commonly associated with a plurality of first CAM entries. Further, a second search priority element can include a programmable value commonly associated with a plurality of second CAM entries.

According to another aspect of the embodiments, a magnitude comparator circuit can further include an input select circuit that selectively outputs the first search address element or first search priority element according to a clock signal.

According to another aspect of the embodiments, a magnitude comparator circuit can further include an output select circuit that selectively outputs a compare result between a first search address element and a second search address element or a compare result between a first search priority element and a second search priority element according to a clock signal.

BRIEF DESCRIPTION OF THE DRAWINGS

FIG. 1 is a block schematic diagram of a content addressable memory (CAM) device according to one embodiment of the present invention.

FIG. 2 is a diagram showing the execution of a search beyond command according to one embodiment of the present invention.

DETAILED DESCRIPTION OF THE EMBODIMENTS

Figure 3:
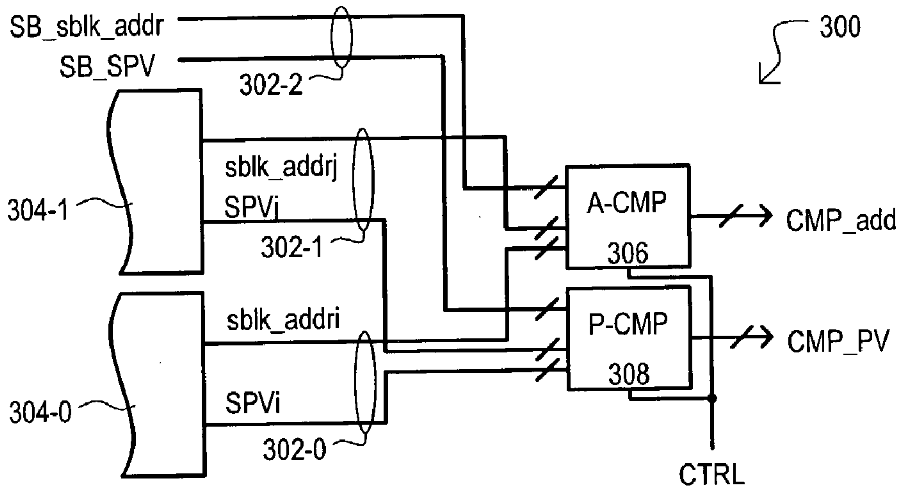
FIG. 3 is a block schematic diagram of a compare section according to another embodiment of the present invention.

Various embodiments of the present invention will now be discussed in conjunction with a number of figures. The embodiments set forth a compare circuit and method that may be included in search operations for a CAM device or the like. Such search operations may include restricted search operations, in which a portion of the CAM entries within a CAM device may be excluded from a search operation.

Referring now to FIG. 1, a content addressable memory (CAM) device according to one embodiment is set forth in a block schematic diagram and designated by the general reference character 100. A CAM device 100 can include a number of "sub-blocks", shown as 102-8 to 102-15. Each sub-block (102-8 to 102-15) may include a number of CAM entries. In a search operation, data within each such CAM entry may be compared to an applied search key to generate a compare result.

Each sub-block may have one or more associated values or search elements, shown as 104-8 to 104-15. Associated values may establish a priority between sub-blocks (102-8 to 102-15). In the particular example of FIG. 1, associated values (104-8 to 104-15) may include a sub-block address value (sblk_addr) and a sub-block "soft" priority value (SPV). A sub-block address value (sblk_addr) may be an address value common to all entries within a given sub-block. Thus, sub-block values shown in FIG. 1 are different for each sub-block (102-8 to 102-15). In contrast, a sub-block soft-priority value (SPV) may be a programmable value. Thus, priority from among multiple sub-blocks can be set irrespective of CAM entry address.

In the very particular example of FIG. 1, sub-blocks (102-8 to 102-15) have sub-block addresses of 8–15, respectively. However, the same sub-blocks (102-8 to 102-15) have priority values of 5, 11, 7, 10, 11, 12, 9 and 10, respectively. Accordingly, assuming a lower magnitude soft-priority value translates into a higher overall priority, in a search operation a sub-block 102-14 (soft-priority=9) will have priority over sub-block 102-11 (soft-priority=10). In this way, CAM entries having a higher address may have priority over CAM entries having a lower address. This is in contrast to a conventional approach that may establish priority based only on a hardware based criteria, such as lowest address value for example.

FIG. 1 shows an arrangement in which four sub-blocks may be arranged into a block, and blocks may be arranged into a super-block. In particular, sub-blocks 102-8 to 102-11 can form a block 106-0, while sub-blocks 102-12 to 102-15 can form a block 106-1. Further, blocks 106-0 to 106-1 can form a super-block 108.

In an "unrestricted" search, it is assumed that all sub-blocks (102-8 to 102-15) may generate search results. Priority from among multiple search results can be established through a series of result compare operations, represented generally by result compare sections, shown as 110-0 to 110-6. In FIG. 1, result compare sections (110-0 to 110-6) together can establish a priority from among sub-blocks (102-8 to 102-15) and a result from a different super-block (SUPER-BLOCK 0).

In contrast, in a "restricted" search (or "search beyond") operation, a sub-block may be excluded from a compare operation according to priority or other criteria for such a sub-block or command. Various approaches to restricted search operations are disclosed in co-pending patent application entitled "METHOD AND APPARATUS FOR RESTRICTED SEARCH OPERATION IN CONTENT ADDRESSABLE MEMORY (CAM) DEVICES" by James et al. and filed on Oct. 28, 2002, the contents of which are incorporated by reference herein.

FIG. 1 shows one example of search criteria for a restricted search operation 112. Such restricted search criteria include a search beyond soft-priority value (SB_SPV), a search beyond sub-block address (SB_sblk_addr), and an offset value. Such values may be provided from another device by way of command data.

FIG. 2 shows one very particular example of how a restricted search operation may be executed in a device like that of FIG. 1. FIG. 2 is a logical representation of how a restricted search operation results may be generated for two sub-blocks. In FIG. 2, soft-priority values for a first and second sub-block are shown as SPVi and SPVj, respectively. Sub-block address values for first and second sub-blocks are shown as sblk_addri and sblk_addrj, respectively. In addition, FIG. 2 includes various operators. Such operators have the following values: "&&" logical AND, "||" logical OR operation, "=" equal-to, ">" greater-than, "<=" less-than-or-equal-to.

Referring to FIG. 2, lines 1 and 2 show two conditions that may indicate that a first sub-block (Ii=1) can be ignored (e.g., result of search operation ignored). It is noted that such a search operation may be done, but a resulting output can be ignored. In other cases, search operations can be disabled in a block or sub-block that is ignored. Thus, according to the example shown, when a restricted search soft-priority value is greater than a first sub-block soft-priority value (SB_SPV>SPVi) the first block can be ignored (Ii=1). Similarly, when a restricted search soft priority value is equal to a first sub-block soft-priority value and a restricted search address is greater than a first sub-block address ((SB_sblk_addr>sblk_addri) && (SB_SPV=SPVi)), the first sub-block can be ignored (Ii=1).

Lines 4 and 5 show conditions for ignoring a second sub-block (Ij=1). The conditions are essentially the same as those described above for a first sub-block.

FIG. 2 also shows the conditions that may activate first and second sub-blocks. However, such an activation can establish a priority from among such sub-blocks. Thus, line 7 shows the conditions that establish a first sub-block as having priority over a second sub-block (ACTi=0, ACTj=0'). Such a higher priority can result in first sub-block results having precedence over the same or similar results from a second sub-block. As but one example, if a first sub-block generated a single match result, and a second sub-block generated a single match result, the result from the first sub-block could have priority over that of the second sub-block. In contrast, if a first sub-block generated a miss (no match) result, and a second sub-block generated a single match result, the result from the second sub-block could have priority over that of the first sub-block, as the type of result is different.

Thus, in the example of FIG. 2, conditions for activating first and second sub-blocks, with a first sub-block having priority are: if neither sub-block is inactive (Ii=0 && Ij=0) and if a first sub-block soft-priority value is less than or equal to a second sub-block soft-priority value (SPVi<=SPVj). Again, such an arrangement assumes a lower priority magnitude equals a higher priority value.

Line 10 shows the conditions that may activate first and second sub-blocks, but with a second sub-block having priority over a first sub-block (ACTi=0', ACTj=0). As shown, the conditions of the illustrated example are: if neither sub-block is inactive (Ii=0 && Ij=0) and if a first sub-block soft-priority value is greater than a second sub-block soft priority value (SPVi>SPVJ).

It is understood that compare operations according to the present invention could be subject to variations. Thus, a sub-block address and/or soft priority compare could determine a "winning" (e.g., highest priority) value based on various compare approaches. To name but a few, a winning value may be a highest magnitude value, a lowest magnitude value, a value that matches some predetermined value, or some combination thereof. Further, priority from among different values may be determined differently. For example, a winning soft-priority value could be a highest magnitude value, while a wining address value could be a lowest magnitude value.

Referring back to FIG. 1, results of a search beyond operation according to criteria 112 and the approach of FIG. 2 are shown. Sub-blocks excluded from a search operation (e.g., ignored) are represented by hatching. The various results will now be described with reference to sub-block pairs 102-8/102-9, 102-10/102-11, 102-12/102-13, and 102-14/102-15.

It is understood that the various criteria 112 can be associated with a search command, and can be applied to all sub-blocks together.

In the case of sub-block pair 102-8/102-9, a search beyond soft priority SB_SPV is ten. Sub-block 102-8 has a lower magnitude soft-priority (5) and thus is excluded, while sub-block 102-9 has a higher magnitude soft-priority (11), and so is active. Again, this example assumes that a lower magnitude value has a higher priority.

In the case of sub-block pair 102-10/102-11, sub-block 102-10 has a lower soft-priority (7) and thus is excluded. Sub-block 102-11 has a soft priority value that is equal to a search beyond soft-priority value. However, because a search beyond sub-block address (SB_sblk_addr) is greater in magnitude than the address of sub-block 102-11, sub-block 102-11 can also be ignored.

In the case of sub-block pair 102-12/102-13, both sub-blocks (102-12 and 102-13) have soft-priority values of greater magnitude than a search beyond soft-priority value. Thus, both sub-blocks can be included in a search operation. However, because a soft-priority for sub-block 102-12 is smaller in magnitude than sub-block 102-13, sub-block 102-12 may have priority over sub-block 102-13, as noted above.

In the case of sub-block pair 102-14/102-15, sub-block 102-14 can be ignored, due to its lower magnitude soft-priority value. Sub-block 102-15 has a soft-priority equal to that of a search beyond soft-priority. However, because the address of sub-block 102-15 is greater than a search beyond sub-block address, sub-block 102-15 may not be ignored.

Accordingly, as can be seen in FIG. 2, a search beyond operation may include a compare operation between sub-block addresses as well as compare operations between soft-priority values. Various examples of compare circuits for performing such functions will now be described.

FIG. 3 is a block diagram of a compare section according to one embodiment. A compare section 300 may receive first priority values 302-0, second priority values 302-1, and third priority values 302-2. In FIG. 3, first priority values 302-0 may include a sub-block address (sblk_addri) and a soft-priority value (SPVi) from a first CAM sub-block 304-0. Second priority values 302-1 may include a sub-block address (sblk_addrj) and a soft-priority value (SPVj) from a second CAM sub-block 304-1.

Third priority values 302-2 may include a search beyond sub-block address (SB_sblk_addr) and soft-priority value (SB_SPV). Sub-block addresses (sblk_addri, sblk_addrj, SB_sblk_addr) may be provided to an address compare circuit 306. Soft-priority values (SPVi, SPVj, SB_SPV) may be provided to a soft-priority compare circuit 308.

An address compare circuit 306 may compare sub-block address values, in a multiplexed fashion, to generate address compare results CMP_add. In the particular example, address compare circuit 306 may generate a first compare result when a control signal CTRL has a first value, and a second compare result when a control signal CTRL has a second value. For example, a first compare result may be a comparison between sblk_addri and SB_sblk_addr, while a second compare result may be a comparison between sblk_addrj and SB_sblk_addr. If reference is made back to FIG. 2, such comparisons can perform the functions (SB_sblk_addr>sblk_addri) and (SB_sblk_addr>sblk_addrj) shown in lines 1 and 4.

In a similar fashion, a priority compare circuit 308 may compare priority values in a multiplexed fashion, to generate priority compare results CMP_PV. For example, a priority compare circuit 308 may generate a first compare result when a control signal CTRL has a first value, and a second compare result when a control signal CTRL has a second value. A first compare result may be a comparison between SPVi and SB_SPV, while a second compare result may be a comparison between SPVJ and SB_SPV. If reference is made back to FIG. 2, such comparisons can perform the functions (SB_SPV=SPVi), (SB_SPV>SPVi), (SB_SPV=SPVj), and (SB_SPV>SPVj), of lines 1, 2, 4, and 5, respectively.

It is noted that while particular comparison types are shown, in other approaches, a comparator may generate various comparison results that may include any of the following: a greater-than (GT) result, an equal-to (EQ) result, a less-than (LT) result, a greater-than-or-equal-to (GTQ) result, or a less-than-or-equal-to (LTQ) result.

Figure 4:
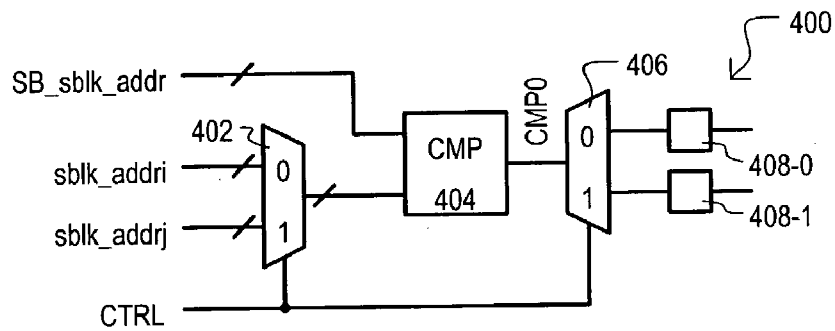
FIG. 4 is a block schematic diagram of a compare circuit according to one embodiment.

Referring now to FIG. 4, a block schematic diagram of a compare circuit according to one embodiment is set forth and designated by the general reference character 400. A compare circuit may be an address compare circuit, like that shown as item 306 in FIG. 3.

A compare circuit 400 may include an input selector 402, a comparator 404, an output selector 406, and output stores 408-0 and 408-1. An input selector 402 may select from among one of at least two input values according to a control signal CTRL. In one particular arrangement, an input selector 402 may include a multiplexer (MUX) that receives two sub-block address values (sblk_addri and sblk_addrj) as inputs, and selects between such values according to a control signal CTRL. In one embodiment, a control signal CTRL may be a periodic timing signal for a CAM device.

A comparator 404 may receive two input values, and compare such values to one another to generate a compare result output CMP0. Such a compare output result may include any of the various results indicated above (GT, EQ, LT, GTQ, and/or LTQ). In one particular arrangement, a comparator 404 may receive a sub-block address selected by an input selector 402 and another search beyond sub-block address SB_sblk_addr. Further, a comparator 404 result output CMP0 may be single bit value that indicates a greater-than result (i.e., either greater-than or not greater-than).

An output selector 406 may output a result CMP0 to one output store 408-0 or another output store 408-1 according to a control signal CTRL. In one particular arrangement, an output selector 406 may include a de-multiplexer (de-MUX) having an input that receives a result from comparator 404, and one output connected to output store 408-0 and another connected to output store 408-1. Further, as noted above, a control signal CTRL may be a periodic timing signal for a CAM device.

In this way, compare operations between three priority criteria (e.g., sub-block addresses) may be established in a time division multiplexed fashion. Such an arrangement may advantageously reduce overall CAM size by utilizing one comparator 404 for two compare operations.

Figure 5:
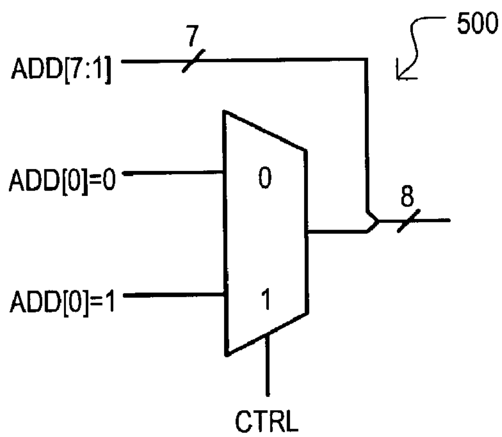
FIG. 5 is a block schematic diagram of an input selector according to one embodiment.

FIG. 5 shows one very particular example of an input selector, like that shown as 402 in FIG. 4. An input selector 500 of FIG. 5 may take advantage of similarities in address values of adjacent sub-blocks. In particular, sub-block addresses for adjacent sub-blocks may vary by only a portion of total address bits, preferably by only one bit. In the very particular example of FIG. 5, sub-block addresses may be eight bit values, and vary by only a least significant bit ADD[0]. Thus, more significant bits ADD[7:1] may not vary, and so can be excluded from a multiplexing function, while least significant bit ADD[0] may be a "0" for one sub-block, and a "1" for another.

It is understood that the various address values shown may be generated by connecting a line to a high or low logic value according to a desired address bit. Such connections may be to high or low power supplies, as in one example.

Figure 6:
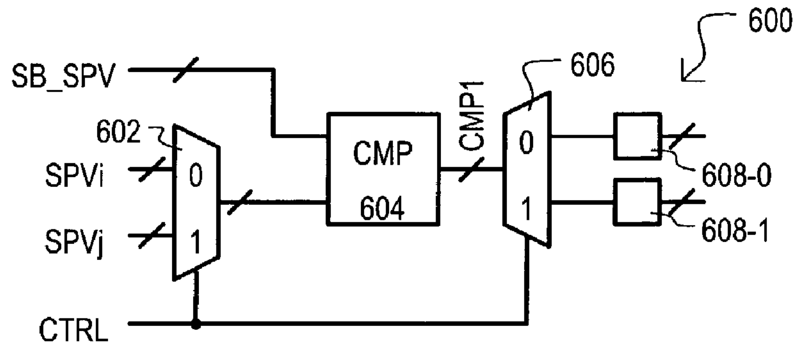
FIG. 6 is a block schematic diagram of a compare circuit according to another embodiment of the present invention.

Referring now to FIG. 6, a block schematic diagram of a compare circuit according to another embodiment is set forth and designated by the general reference character 600. A compare circuit may be a soft-priority compare circuit, like that shown as item 308 in FIG. 3.

A compare circuit 600 may have sections similar to those of FIG. 4, including an input selector 602, a comparator 604, an output selector 606, and output stores 608-0 and 608-1. Like FIG. 4, an input selector 602 may select from among one of at least two input values according to a control signal CTRL, and may include a MUX. However, such MUX inputs may be sub-block priority values (SPVi and SPVj).

A comparator 604, like 404 of FIG. 4, may compare input values to generate a compare result output CMP1. Such a compare output result may include any of the various results indicated above (GT, EQ, LT, GTQ, and/or LTQ). However, in one particular arrangement, a comparator 604 may receive a sub-block soft-priority value selected by an input selector 602 and another soft-priority value SB_SPV. A comparator 604 result CMP1 may be a two-bit value that indicates either a GT result or an EQ result.

An output selector 606 may output a result CMP1 to one output store 608-0 or another output store 608-1 according to a control signal CTRL. Like output selector 406 of FIG. 4, output selector 606 can include a de-MUX.

In this way, compare operations between three priority criteria (e.g., soft-priority values) may also be established in a time division multiplexed fashion.

Figure 7:
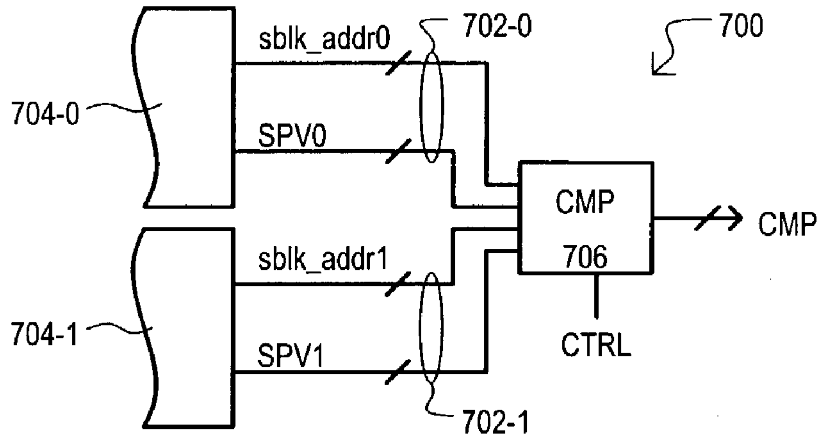
FIG. 7 is a block schematic diagram of a compare section according to another embodiment of the present invention.

It is understood that while the various examples of FIGS. 3–7 have illustrated arrangements in which multiplexing may occur between three priority related values, the present invention may also include such multiplexing between different portions of two priority values. One such example is shown in FIG. 7.

FIG. 7 is a block diagram of a compare section according to another embodiment. A compare section 700 may receive first priority values 702-0 and second priority values 702-1. In FIG. 7, like FIG. 3, first priority values 702-0 may include a sub-block address (sblk_addr0) and a corresponding soft-priority value (SPV0). Second priority values 702-1 may also include a sub-block address (sblk_addr1) and a soft-priority value (SPV1).

Such priority values may represent values of a sub-block within a CAM device or priority criteria provided for a search, or search beyond command, as described above.

A compare section 700 may include an address compare circuit 706 that can compare first priority values 702-0 to second priority values 702-1, to generate compare results CMP. In the particular example shown, compare circuit 706 may generate a first portion compare result when a control signal CTRL has a first value, and a second portion compare result when a control signal CTRL has a second value. A first portion compare result can be a comparison between soft-priority values SPV0 and SPV1, while a second compare result may be a comparison between sub-block addresses sblk_addr0 and sblk_addr1.

Of course, as in the case of FIG. 3, comparison results may be magnitude compare results that may include any of GT, EQ, LT, GTQ, or LTQ results.

Figure 8:
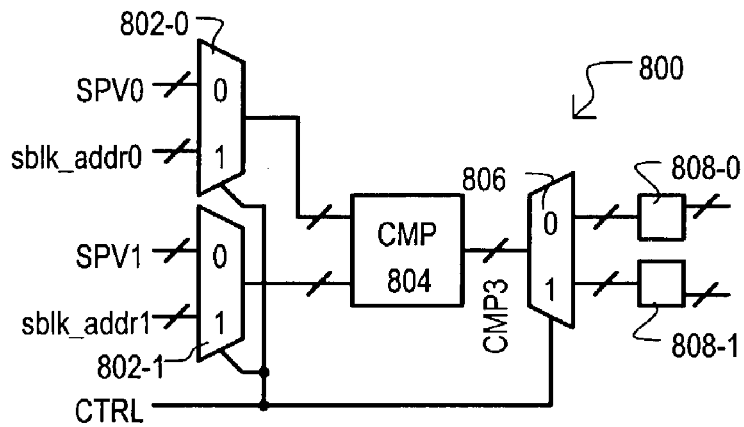
FIG. 8 is a block schematic diagram of a compare circuit according to another embodiment of the present invention.
Figure 9A:
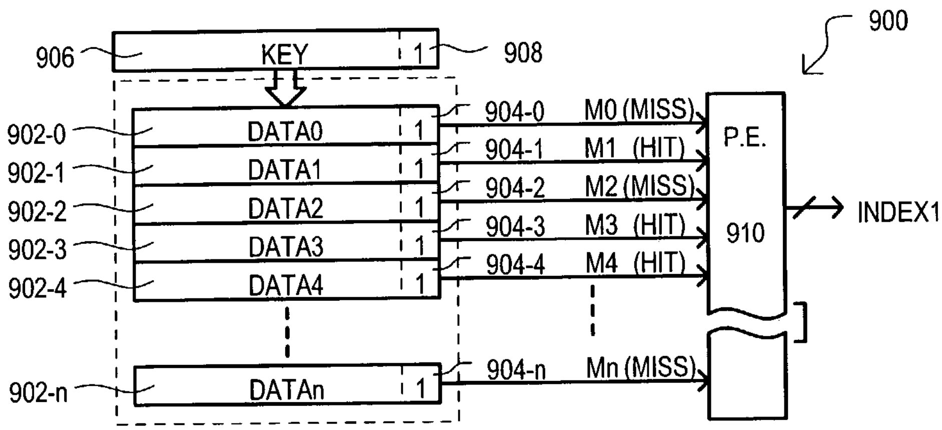
FIGS. 9A to 9C are block diagrams showing a conventional operation of a CAM device.
Figure 9B:
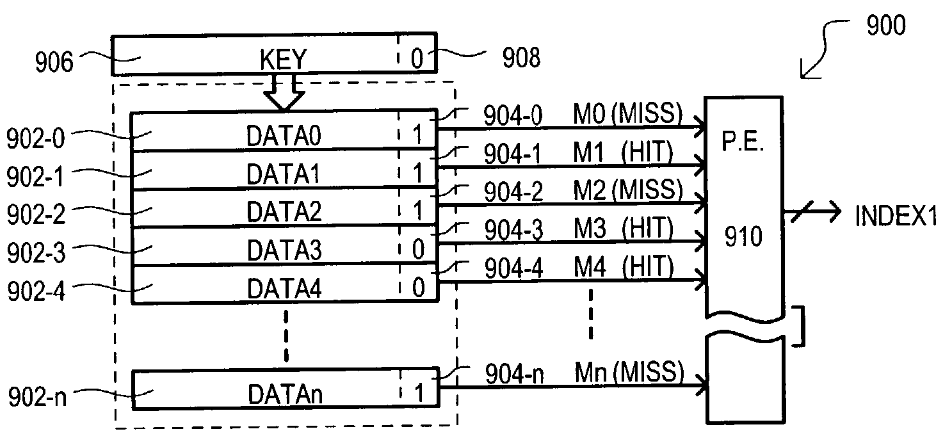
Figure 9C:
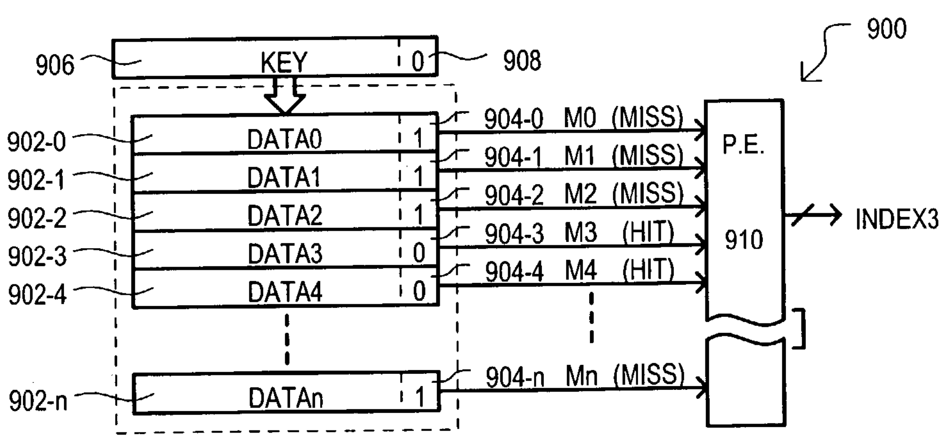

Referring now to FIG. 8, a block schematic diagram of a compare circuit according to another embodiment is set forth and designated by the general reference character 800.

A compare circuit 800 may be a compare circuit, like that shown as item 706 in FIG. 7.

A compare circuit 800 may include two input selectors 802-0 and 802-1, a comparator 804, an output selector 806, and output stores 808-0 and 808-1. A first input selector 802-0 may select from among one of at least two input values according to a control signal CTRL. In the particular arrangement shown, input selector 802-0 may include a multiplexer (MUX) that receives a priority value SPV0 and address value sblk_addr0 as inputs, and selects between such values according to a control signal CTRL. Similarly, input selector 802-1 may include a MUX that receives a priority value SPV1 and address value sblk_addr1, and selects between such values according to a control signal CTRL. As in the other embodiments, a control signal CTRL may be a periodic timing signal for a CAM device.

A comparator 804 may receive two input values, and compare such values to one another to generate a compare result output CMP3. Such a compare output result may include any of the various results indicated above (GT, EQ, LT, GTQ, and/or LTQ).

An output selector 806 may output a result output CMP3 to one output store 808-0 or another output store 808-1 according to a control signal CTRL.

In this way, compare operations between to different portions of two priority criteria (e.g., sub-block addresses and sub-block priority values) may be established in a time division multiplexed fashion. Such an arrangement may advantageously reduce overall CAM size utilizing one comparator 804 for two compare operations.

It is understood that the various compare operations could be subject to variations. A "winning" (e.g., highest priority) value may be based on assorted compare approaches. To name but a few, a winning value may be a highest magnitude value, a lowest magnitude value, a value that matches some predetermined value, or some combination thereof. Further, priority from among different portions of priority values may be determined differently. For example, a winning soft-priority value PRIORITY may be a highest magnitude value, while a winning address value ADD may be a lowest magnitude value.

Thus, while the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising:

an input select circuit that provides a first value associated with a first CAM portion during a first time period, and provides a second value associated with a second CAM portion during a second time period; and at least one comparator circuit having at least two inputs, at least a first input of the comparator circuit being coupled to an output of the input select circuit.

2. The CAM device of claim 1, wherein:

the input select circuit includes a multiplexer having a first input that receives the first value and a second input that receives the second value, and a control input coupled to a control signal.

3. The CAM device of claim 1, wherein:

the first value is a first sub-block address common to the CAM entries of the first portion; and the second value is a second sub-block address common to the CAM entries of the second portion.

4. The CAM device of claim 3, wherein the first and second sub-block addresses are multi-bit values that differ from one another by one bit.

5. The CAM device of claim 1, further including:

an output select circuit that provides a first compare result from the at least one comparator circuit during the first time period, and provides a second compare result from the at least one comparator circuit during the second time period.

6. The CAM device of claim 5, wherein the output select circuit includes a de-multiplexer having first input coupled to the compare circuit and a control input coupled to a control signal.

7. The CAM device of claim 1, wherein at least a second input of the comparator circuit is coupled to receive a third value associated with a search command.

8. The CAM device of claim 1, further including:

a first output store coupled to the at least one comparator circuit for storing a first compare result, and a second output store coupled to the at least one comparator circuit for storing a second compare result.

9. A method of establishing priority from among portions of a content addressable memory (CAM) device, comprising the steps of:

comparing priority values associated with CAM entries of different portions of a CAM device at different time periods in a single comparator, where the different portions each include a plurality of CAM entries.

10. The method of claim 9, wherein:

the priority values include sub-block address values for a CAM device including multiple sub-blocks of entries, each sub-block comprising a plurality of CAM entries.

11. The method of claim 10, wherein:

comparing the priority values includes:

comparing a first sub-block address to a search sub-block address when a control signal has a first value, and comparing a second sub-block address to the search sub-block address when the control signal has a second value.

12. The method of claim 9, wherein:

the priority values include sub-block soft-priority values for a CAM device having multiple sub-blocks of entries, such sub-block soft-priority values being programmable.

13. The method of claim 9, further including:

outputting compare results generated by comparing the priority values at different time periods.

14. The method of claim 13, wherein:

the priority values include sub-block address values for a CAM device having multiple sub-blocks of entries; and outputting compare results includes:

outputting a first compare result between a first sub-block address and a search sub-block address when a control signal has a first value, and outputting a second compare result between a second sub-block address and the search sub-block address when the control signal has a second value.

15. The method of claim 9, wherein:

the priority values include sub-block address values and sub-block soft-priority values for a CAM device having multiple sub-blocks of entries, the soft-priority values being programmable; and comparing the priority values includes:

generating an ignore indication for a first sub-block if a search soft-priority value is greater than a first sub-block soft-priority value, or if the search soft-priority value is equal to the first sub-block soft-priority value and the search sub-block address value is greater than a first sub-block address, and generating an ignore indication for a second sub-block if the search soft-priority value is greater than a second sub-block soft-priority value, or if the search soft-priority value is equal to the second sub-block soft-priority value and the search sub-block address value is greater than a second sub-block address value.

16. A magnitude comparator, comprising:

a circuit that compares a magnitude of a first search address element to a magnitude of a second search address element during a first predetermined time interval and compares a magnitude of a first search priority element to a magnitude of a second search priority element during a second predetermined time interval;

the first search priority element being a programmable value commonly associated with a plurality of first CAM entries, and the second search priority element being a programmable value commonly associated with a plurality of second CAM entries.

17. The magnitude comparator of claim 16, wherein:

the first search address element is an address commonly associated with a plurality of first CAM entries; and the second search address element is an address commonly associated with a plurality of second CAM entries.

18. The magnitude comparator circuit of claim 16, further including:

an input select circuit that selectively outputs the first search address element or first search priority element according to a control signal.

19. The magnitude comparator circuit of claim 18, further including:

an output select circuit that selectively outputs a compare result between the first search address element and the second search address element or a compare result between the first search priority element and the second search priority element according to the control signal.

* * * * *